United States Patent
Mori et al.

(10) Patent No.: US 8,482,644 B2
(45) Date of Patent: Jul. 9, 2013

(54) SOLID-STATE IMAGING DEVICE

(75) Inventors: Harumichi Mori, Hamamatsu (JP); Kazuki Fujita, Hamamatsu (JP); Ryuji Kyushima, Hamamatsu (JP); Masahiko Honda, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 549 days.

(21) Appl. No.: 12/307,173

(22) PCT Filed: Jul. 3, 2007

(86) PCT No.: PCT/JP2007/063306
§ 371 (c)(1),
(2), (4) Date: Feb. 10, 2009

(87) PCT Pub. No.: WO2008/004551
PCT Pub. Date: Jan. 10, 2008

(65) Prior Publication Data
US 2009/0295954 A1 Dec. 3, 2009

(30) Foreign Application Priority Data
Jul. 4, 2006 (JP) ................. P2006-184514

(51) Int. Cl.
*H04N 3/14* (2006.01)
*H04N 5/335* (2006.01)
(52) U.S. Cl.
USPC ............................ 348/308; 348/294; 348/302
(58) Field of Classification Search
None
See application file for complete search history.

(56) References Cited

U.S. PATENT DOCUMENTS

| 4,996,413 | A | 2/1991 | McDaniel et al. |
| 7,329,851 | B2 * | 2/2008 | Sugiyama et al. ......... 250/214.1 |
| 7,514,690 | B2 * | 4/2009 | Endo et al. ............... 250/370.14 |
| 7,692,693 | B2 * | 4/2010 | Misawa ..................... 348/229.1 |
| 7,705,901 | B2 * | 4/2010 | Kobayashi .................... 348/315 |
| 2002/0001366 | A1 | 1/2002 | Tamura et al. |
| 2002/0036257 | A1 | 3/2002 | Yamashita et al. |
| 2002/0121652 | A1 * | 9/2002 | Yamasaki ..................... 257/222 |
| 2002/0191828 | A1 | 12/2002 | Colbeth et al. |

(Continued)

FOREIGN PATENT DOCUMENTS

| EP | 1 139 118 | 10/2001 |
| EP | 1 185 089 | 3/2002 |

(Continued)

*Primary Examiner* — Sinh Tran
*Assistant Examiner* — Jason Flohre
(74) *Attorney, Agent, or Firm* — Drinker Biddle & Reath LLP

(57) ABSTRACT

For a solid-state image pickup device 1, a plurality of pixels are two dimensionally arranged in an imaging region 10, and two photodiodes $PD_1$ and $PD_2$ are included in each pixel $P_{m,n}$. An electric charge generated in the respective photodiodes $PD_1$ and $PD_2$ is input to a signal readout section 20, and a voltage according to an electric charge amount thereof is output from the signal output section 20. The voltage output from the signal readout section 20 is input to an A/D converting section 40, and a digital value according to the input voltage is output from the A/D converting section 40. In an adding section 50, a sum of digital values to be output from the A/D converting section 40 according to the amount of electric charge generated, for each pixel $P_{m,n}$ of the imaging region 10, in the two respective photodiodes $PD_1$ and $PD_2$ included in the pixel is operated, and a digital value being a sum value thereof is output.

5 Claims, 2 Drawing Sheets

U.S. PATENT DOCUMENTS

| | | |
|---|---|---|
| 2005/0121616 A1* | 6/2005 | Petrick .................... 250/370.09 |
| 2005/0151873 A1* | 7/2005 | Murakami .................... 348/340 |
| 2006/0104417 A1* | 5/2006 | Kameshima et al. ........... 378/98 |
| 2006/0170802 A1 | 8/2006 | Misawa |
| 2007/0096032 A1* | 5/2007 | Yagi et al. ................ 250/370.11 |

FOREIGN PATENT DOCUMENTS

| | | |
|---|---|---|
| EP | 1 453 098 | 9/2004 |
| JP | 3-187686 | 8/1991 |
| JP | 2001-284562 | 10/2001 |
| JP | 2001-340323 | 12/2001 |
| JP | 2002-76317 | 3/2002 |
| JP | 2005-197379 | 7/2005 |
| JP | 2005-333250 | 12/2005 |
| JP | 2006-238410 | 9/2006 |
| WO | WO 02/28095 | 4/2002 |

* cited by examiner

SOLID-STATE IMAGING DEVICE

TECHNICAL FIELD

The present invention relates to a solid-state image pickup device having an imaging region in which a plurality of pixels respectively including photodiodes are arranged two dimensionally.

BACKGROUND ART

Recently, in the field of radiography for dental treatment, there has been a transition from conventional photography using X-ray sensitive films to imaging by image pickup devices using camera tubes such as X-ray image intensifiers that do not use films, solid-state image pickup devices for which scintillates and CCDs are combined, and the like (see Patent Document 1, for example). However, the image intensifiers are camera tubes, and thus have problems such that the size is large, and an image distortion occurs in the periphery of an imaging region. Moreover, the CCDs, since it is technically difficult to form imaging regions with large areas, have restrictions such as performing imaging by a line scanner system.

As an image pickup device for solving these problems, a CMOS-X-ray flat panel sensor can be mentioned. The X-ray flat panel sensor uses a CMOS solid-state image pickup device having an imaging region in which a plurality of pixels respectively including photodiodes are arranged two dimensionally, and thus has no distortion in a peripheral portion, and it is easy to provide the imaging region with a large two-dimensional area (for example, about 12 cm×12 cm). Unlike visible light, since X-rays cannot be condensed by a lens, the solid-state image pickup device requires an imaging region with a large area when imaging a large area at one time, such as when being applied to dental use (particularly, dental 3D-CT).

Moreover, for such a solid-state image pickup device for medical use, the imaging subject is, for example, a living body, and thus the required resolution is low, and moreover, it is necessary to improve sensitivity while suppressing the amount of X-ray exposure as much as possible. Based thereon, in the solid-state image pickup device for medical use, the area of a photosensitive region (region to generate an electric charge in response to incidence of light) of each pixel included in the imaging region is no less than about 10 times to 100 times larger than that of another solid-state image pickup device for general imaging.

In, for example, a solid-state image pickup device for dental 3D-CT, VOXELs to be used for reconstruction of a CT image have square shapes, and it thus becomes indispensable that the shape of a photosensitive region of each pixel is a square one side of which has a length of, for example, 150 μm to 200 μm. Since the photosensitive region of each pixel thus having a large area means that the number of pixels included in the imaging region is small, this becomes advantageous in respect to performing drive at a video rate of 30 frames/second.

Patent Document 1: Japanese Published Unexamined Patent Application No. 2005-333250

DISCLOSURE OF THE INVENTION

Problem to be Solved by the Invention

However, when the photosensitive region of each pixel is large, the photodiode also has a large junction capacitance value, and for this reason, noise is also large. On the other hand, for securing a necessary S/N ratio, it becomes necessary to increase the amount of X-rays to be made incident into the solid-state image pickup device. For a dental application, however, since X-rays are irradiated onto a human body, it is an absolute proposition to reduce the amount of X-ray exposure to the human body by reducing the amount of X-rays, and an increase in the amount of X-rays must be suppressed.

The present invention has been made in order to solve the above problems, and an object thereof is to provide a solid-state image pickup device that is capable of performing imaging with an excellent S/N ratio and is also suitable for a dental application.

Means for Solving the Problem

A solid-state image pickup device according to the present invention includes: (1) an imaging region in which a plurality of pixels each including a plurality of photodiodes are arranged two dimensionally; (2) a signal readout section for outputting a voltage according to an amount of electric charge generated in the plurality of respective photodiodes included in each pixel of the imaging region; (3) an A/D converting section for being input with and A/D-converting a voltage output from the signal readout section, and outputting a digital value according to the input voltage; and (4) an adding section for operating, for each pixel of the imaging region, a sum of digital values to be output from the A/D converting section according to an amount of electric charge generated in the plurality of respective photodiodes included in the pixel, and outputting a digital value being a sum value thereof. Furthermore, photosensitive regions of the plurality of respective photodiodes included in each pixel of the imaging region have a square shape as a whole. Moreover, photosensitive regions of the plurality of respective photodiodes included in each pixel of the imaging region preferably have mutually equal areas. Also, these areas may have an error within 5%.

In the solid-state image pickup device, a plurality of pixels are arranged two dimensionally in the imaging region, and each pixel includes a plurality of photodiodes. An electric charge generated in the plurality of respective photodiodes included in each pixel of the imaging region is input to the signal readout section, a voltage according to the amount of electric charge is output from the signal readout section. The voltage output from the signal readout section is input to the A/D converting section, and a digital value according to the input voltage is output from the A/D converting section. Then, in the adding section, for each pixel of the imaging region, a sum of digital values to be output from the A/D converting section according to an amount of electric charge generated in the plurality of respective photodiodes included in the pixel is operated, and a digital value being a sum value thereof is output.

Effects of the Invention

A solid-state image pickup device according to the present invention is capable of performing imaging with an excellent S/N ratio and can also be suitably used for a dental application.

BRIEF DESCRIPTION OF THE DRAWINGS

FIG. 3 are plan views showing the shapes of respective photosensitive regions of two respective photodiodes $PD_1$ and $PD_2$ included in the pixel $P_{m,n}$ of the solid-state image pickup device 1 according to the present embodiment, wherein FIG. 3(a) shows a pair of rectangular photodiodes adjacent in the transverse direction, FIG. 3(b) shows a pair of rectangular photodiodes adjacent in the longitudinal direction, FIG. 3(c) shows a pair of triangular photodiodes adjacent to each other, and FIG. 3(d) shows a pair of trapezoidal photodiodes adjacent to each other.

FIG. 4 is a timing chart explaining operation of the solid-state image pickup device 1 according to the present embodiment, wherein FIG. 4(a) shows timing of the switch $SW_{21}$ of each integrating circuit $21_{n,k}$, FIG. 4(b) shows timing of the switch $SW_1$, $SW_2$ of each pixel $P_{m,n}$ on the m-th row, FIG. 4(c) shows timing of a switch $SW_{221}$ of each holding circuit $22_{n,k}$, FIG. 4(d1) shows timing of a switch $SW_{222}$ of a holding circuit $22_{1,1}$, FIG. 4(d2) shows timing of the switch $SW_{222}$ of a holding circuit $22_{1,2}$, FIG. 4(d3) shows timing of the switch $SW_{222}$ of a holding circuit $22_{2,1}$, FIG. 4(d4) shows timing of the switch $SW_{222}$ of a holding circuit $22_{2,2}$, FIG. 4(d5) shows timing of the switch $SW_{222}$ of a holding circuit $22_{3,1}$, FIG. 4(d6) shows timing of the switch $SW_{222}$ of a holding circuit $22_{3,2}$, and FIG. 4(e) shows timing of output of the A/D converting section 40, and FIG. 4(f) shows timing of output of the adding section 50.

DESCRIPTION OF NUMERALS AND SYMBOLS

Figure 2:
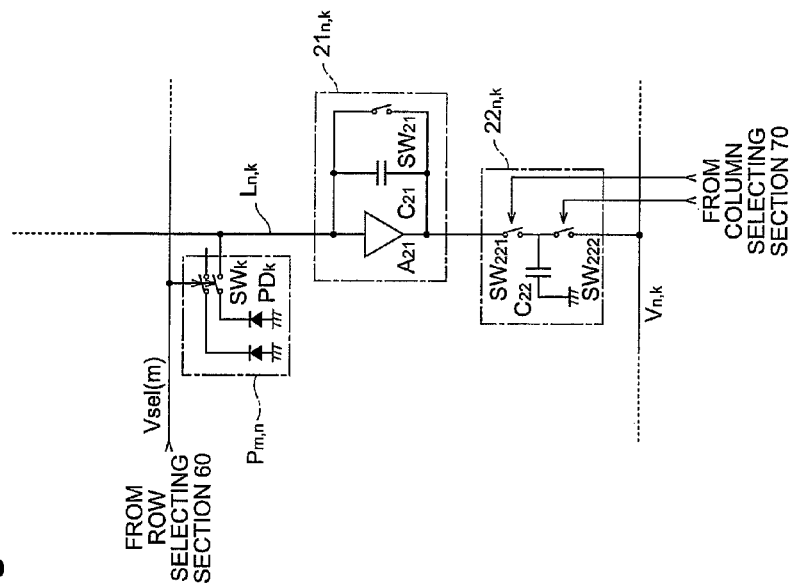
FIG. 2 is a circuit diagram of each of the pixel $P_{m,n}$, integrating circuit $21_{n,k}$, and holding circuit $22_{n,k}$ of the solid-state image pickup device 1 according to the present embodiment.

1 Solid-state image pickup device
10 Imaging region
20 Signal readout section
21 Integrating circuit
22 Holding Circuit
30 Buffer circuit
40 A/D converting section
50 Adding section
60 Row selecting section
70 Column selecting section
A Amplifier
C Capacitor
PD Photodiode
SW Switch

BEST MODES FOR CARRYING OUT THE INVENTION

Hereinafter, a best mode for carrying out the present invention will be described in detail with reference to the accompanying drawings. Here, in the description of the drawings, identical elements are denoted by identical reference numerals and symbols so as to avoid overlapping descriptions.

Figure 1:
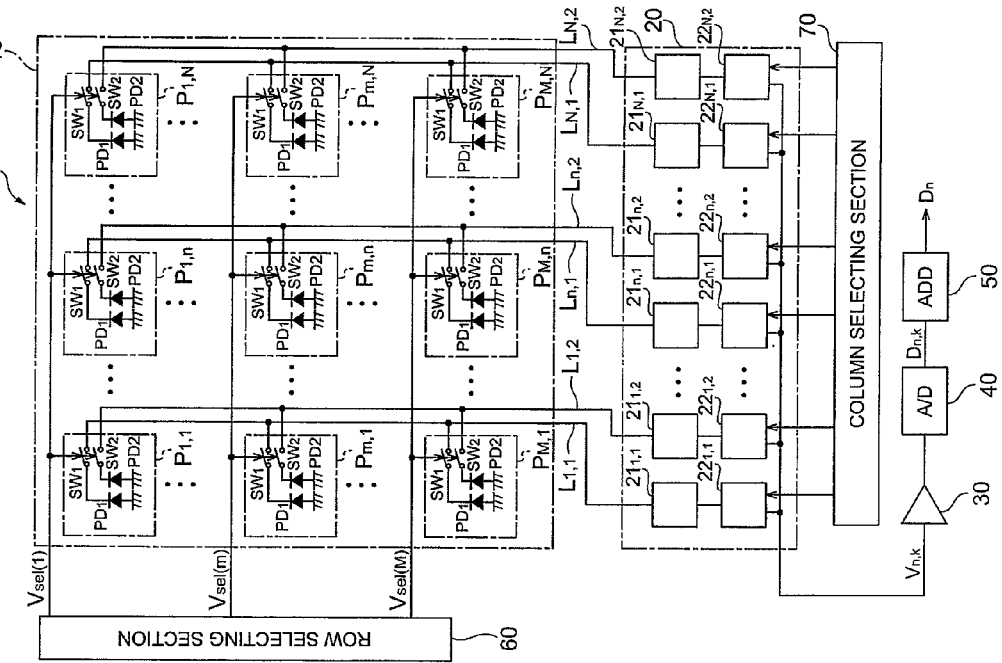
FIG. 1 is a block diagram of a solid-state image pickup device 1 according to the present embodiment.

FIG. 1 is a block diagram of a solid-state image pickup device 1 according to the present embodiment. The solid-state image pickup device 1 shown in this figure includes an imaging region 10, a signal readout section 20, a buffer circuit 30, an A/D converting section 40, an adding section 50, a row selecting section 60, and a column selecting section 70.

The imaging region 10 is a region where M×N pixels $P_{1,1}$ to $P_{M,N}$ are arranged two dimensionally in M rows and N columns. A pixel $P_{m,n}$ is located at the m-th row and the n-th column. Here, each of M and N is an integer not less than 2, m is an integer not less than 1 and not more than M, and n is an integer not less than 1 and not more than N. Each of the M×N pixels $P_{1,1}$ to $P_{M,N}$ has a common configuration, and includes two photodiodes $PD_1$ and $PD_2$ and two switches $SW_1$ and $SW_2$.

The switch $SW_1$, $SW_2$ included in each pixel $P_{m,n}$ is controlled in a switching operation by an m-th row selecting signal Vsel(m) to be output from the row selecting section 60. The photodiode $PD_1$ included in each pixel $P_{m,n}$ is grounded at its anode terminal and connected at its cathode terminal to a wiring $L_{n,1}$ via the switch $SW_1$, and outputs an electric charge of an amount according to the amount of incident light when the switch $SW_1$ is closed to a wiring $L_{n,1}$. The photodiode $PD_2$ included in each pixel $P_{m,n}$ is also grounded at its anode terminal and connected at its cathode terminal to a wiring $L_{n,2}$ via the switch $SW_2$, and outputs an electric charge of an amount according to the amount of incident light when the switch $SW_2$ is closed to a wiring $L_{n,2}$.

The signal readout section 20 outputs a voltage according to the amount of an electric charge generated in the two respective photodiodes $PD_1$ and $PD_2$ included in each pixel $P_{m,n}$ of the imaging region 10, and includes 2N integrating circuits $21_{1,1}$ to $21_{N,2}$ and 2N holding circuits $22_{1,1}$ to $22_{N,2}$. The 2N respective integrating circuits $21_{1,1}$ to $21_{N,2}$ have a common configuration. The 2N respective holding circuits $22_{1,1}$ to $22_{N,2}$ also have a common configuration.

Each integrating circuit $21_{n,k}$ accumulates an electric charge input through a wiring $L_{n,k}$, and outputs a voltage according to the amount of the accumulated electric charge. Each holding circuit $22_{n,k}$ is input with and holds a voltage output from the integrating circuit $21_{n,k}$, and outputs the holding voltage $V_{n,k}$ based on an instruction from the column selecting section 70. Here, k is 1 or 2. At this time, the signal readout section 20 outputs voltages $V_{1,1}$, $V_{1,2}$, $V_{2,1}$, $V_{2,2}$, $V_{3,1}$, $V_{3,2}$, ..., $V_{n,1}$, $V_{n,2}$, ..., $V_{N,1}$, and $V_{N,2}$, in order.

An A/D converting section 40 is input with and A/D-converts the voltage $V_{n,k}$ output from the signal readout section 20 and passed through the buffering circuit 30, and outputs a digital value $D_{n,k}$ according to the input voltage $V_{n,k}$. The adding section 50 operates, for each pixel $P_{m,n}$ of the imaging region 10, a sum of digital values $D_{n,1}$ and $D_{n,2}$ to be output from the A/D converting section 40 according to the amount of an electric charge generated in the two respective photodiodes $PD_1$ and $PD_2$ included in the pixel $P_{m,n}$, and outputs a digital value $D_n$ ($=D_{n,1}+D_{n,2}$) being a sum value thereof.

The row selecting section 60 outputs the m-th row selecting signal Vsel(m) to control a switching operation of the switch $SW_1$, $SW_2$ included in each of the N pixels $P_{m,1}$ to $P_{m,N}$ existing on the m-th row of the imaging region 10. These M row selecting signals Vsel(1) to Vsel(M) sequentially become high level. The row selecting section 60 makes, when the m-th row selecting signal Vsel(m) is high level, an electric charge generated in the photodiode $PD_1$, $PD_2$ included in each of the N pixels $P_{m,1}$ to $P_{m,N}$ existing on the m-th row be output to the wiring $L_{n,1}$, $L_{n,2}$ through the switch $SW_1$, $SW_2$ of the same pixel.

The column selecting section 70 controls output of a holding voltage for each of the 2N holding circuits $22_{1,1}$ to $22_{N,2}$ included in the signal readout section 20 to make the signal readout section 20 output voltages $V_{1,1}$, $V_{1,2}$, $V_{2,1}$, $V_{2,2}$, $V_{3,1}$, $V_{3,2}$, ..., $V_{n,1}$, $V_{n,2}$, ..., $V_{N,1}$, and $V_{N,2}$, in order.

FIG. 2 is a circuit diagram of each of the pixel $P_{m,n}$, integrating circuit $21_{n,k}$, and holding circuit $22_{n,k}$ of the solid-state image pickup device 1 according to the present embodiment. Here, the figure shows these as representatives. As described above, m is an integer not less than 1 and not more than M, n is an integer not less than 1 and not more than N, and k is 1 or 2.

Each integrating circuit $21_{n,k}$ has an amplifier $A_{21}$, a capacitor $C_{21}$, and a switch $SW_{21}$. An input terminal of the amplifier $A_{21}$ included in the integrating circuit $21_{n,k}$ is connected, via a wiring $L_{n,k}$, to a switch $SW_k$ included in the pixel $P_{m,n}$. The capacitor $C_{21}$ and the switch $SW_{21}$ are provided in parallel between the input terminal and output terminal of the amplifier $A_{21}$. For the integrating circuit $21_{n,k}$, as a result of the switch $SW_{21}$ being closed, the capacitor $C_{21}$ is discharged, and a voltage to be output from the integrating circuit $21_{n,k}$, is initialized. Moreover, the integrating circuit $21_{n,k}$ accumulates, when the switch $SW_{21}$ is open, an electric charge input through the wiring $L_{n,k}$ in the capacitor $C_{21}$, and outputs a voltage according to the amount of the accumulated electric charge to the holding circuit $22_{n,k}$.

Each holding circuit $22_{n,k}$ has a capacitor $C_{22}$ and switches $SW_{22}$, and $SW_{222}$. One end of the capacitor $C_{22}$ is connected with the output terminal of the amplifier $A_{21}$ of the integrating circuit $21_{n,k}$ via the switch $SW_{221}$, and is also connected with the buffer circuit 30 via the switch $SW_{222}$. The other end of the capacitor $C_{22}$ is connected to a ground potential. The holding circuit $22_{n,k}$ holds, as a result of the switch $SW_{221}$ being turned from a closed state to an opened state, a voltage $V_{n,k}$ being output at that point in time from the integrating circuit $21_{n,k}$ in the capacitor $C_{22}$. Then, the holding circuit $22_{n,k}$ outputs, when the switch $SW_{222}$ is closed, the voltage $V_{n,k}$ being held in the capacitor $C_{22}$ to the buffer circuit 30.

Figure 3:
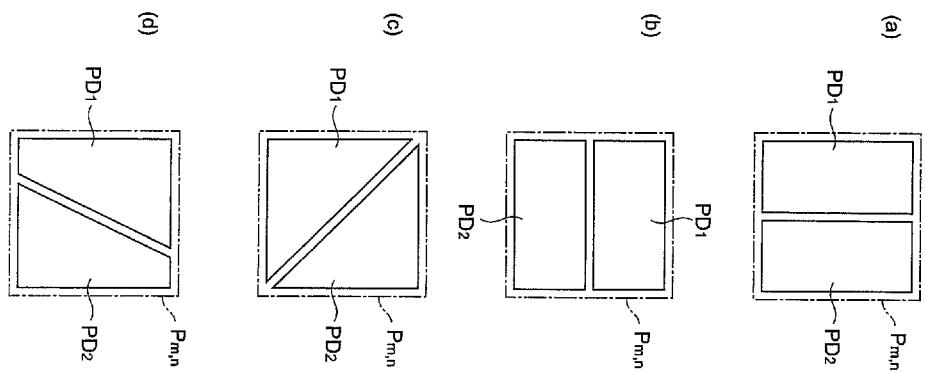

FIG. 3 are plan views showing the shapes of photosensitive regions of two respective photodiodes $PD_1$ and $PD_2$ included in the pixel $P_{m,n}$ of the solid-state image pickup device 1 according to the present embodiment. As shown in the same figures, respective photosensitive regions of the two photodiodes $PD_1$ and $PD_2$ included in each pixel $P_{m,n}$ have a square shape as a whole. Two adjacent sides of the square may have an error of not more than 5%. Moreover, the respective photosensitive regions of the two photodiodes $PD_1$ and $PD_2$ included in each pixel $P_{m,n}$ preferably have mutually equal areas. Also, these areas may have an error of not more than 5%. The respective photosensitive regions of the two photodiodes $PD_1$ and $PD_2$ included in each pixel $P_{m,n}$ may have rectangular shapes as shown in FIG. 3(a) and FIG. 3(b), may have triangular shapes as shown in FIG. 3(c), and may have trapezoidal shapes as shown in FIG. 3(d).

Figure 4:
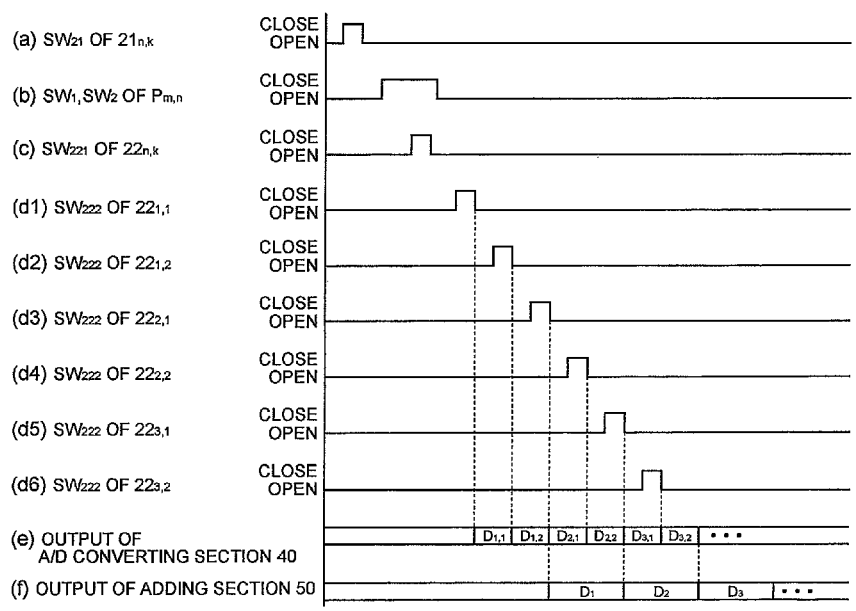

Next, description will be given of operation of the solid-state image pickup device 1 according to the present embodiment. The solid-state image pickup device 1 operates while being controlled by the row selecting section 60 and the column selecting section 70 and a control section that controls operation of the entire solid-state image pickup device 1. FIG. 4 is a timing chart explaining operation of the solid-state image pickup device 1 according to the present embodiment.

FIG. 4(a) shows timing of the switch $SW_{21}$ of each integrating circuit $21_{n,k}$, FIG. 4(b) shows timing of the switch $SW_1$, $SW_2$ of each pixel $P_{m,n}$ on the m-th row, FIG. 4(c) shows timing of the switch $SW_{221}$ of each holding circuit $22_{n,k}$, FIG. 4(d1) shows timing of the switch $SW_{222}$ of the holding circuit $22_{1,1}$, FIG. 4(d2) shows timing of the switch $SW_{222}$ of the holding circuit $22_{1,2}$, FIG. 4(d3) shows timing of the switch $SW_{222}$ of the holding circuit $22_{2,1}$, FIG. 4(d4) shows timing of the switch $SW_{222}$ of the holding circuit $22_{2,2}$, FIG. 4(d5) shows timing of the switch $SW_{222}$ of the holding circuit $22_{3,1}$, FIG. 4(d6) shows timing of the switch $SW_{222}$ of the holding circuit $22_{3,2}$, and FIG. 4(e) shows timing of output of the A/D converting section 40, and FIG. 4(f) shows timing of output of the adding section 50.

More specifically, the figure shows (a) a switching operation of the switch $SW_{21}$ of each integrating circuit $21_{n,k}$, (b) a switching operation of the switch $SW_1$, $SW_2$ of each pixel $P_{m,n}$ on the m-th row, (c) a switching operation of the switch $SW_{221}$ of each holding circuit $22_{n,k}$, (d1) to (d6) switching operations of the switch $SW_{222}$ of each holding circuit $22_{n,k}$, (e) an A/D converting operation in the A/D converting section 40, and (f) an adding operation in the adding section 50.

When determining digital values $D_1$ to $D_N$ according to the amount of incident light in the N respective pixels $P_{m,1}$ to $P_{m,N}$ existing on the m-th row, first, in each of the 2N integrating circuits $21_{1,1}$ to $21_{N,2}$, the switch $SW_{21}$ is closed for only a fixed period, whereby the capacitor $C_{21}$ is discharged, and output voltage is initialized.

Thereafter, in each of the N pixels $P_{m,1}$ to $P_{m,N}$ existing on the m-th row, the m-th row selecting signal Vsel(m) to be input becomes high level for only a fixed period, the switches $SW_1$ and $SW_2$ are closed for only a fixed period, and in the period where these are closed, an electric charge that has been accumulated until then in a junction capacitance section in response to incidence of light in the photodiode $PD_1$, $PD_2$ is output to the wiring $L_{n,1}$, $L_{n,2}$ through the switch $SW_1$, $SW_2$. At this time, in each integrating circuit $21_{n,k}$, the switch $SW_{21}$ is open, so that an electric charge input from the pixel $P_{m,n}$ through the wiring $L_{n,k}$ is accumulated in the capacitor $C_{21}$, and a voltage according to the amount of the accumulated electric charge is output to the holding circuit $22_{n,k}$.

Moreover, in the period where the m-th row selecting signal Vsel(m) is high level, the switch$_{221}$ is closed for only a fixed period in each holding circuit $22_{n,k}$, and the voltage $V_{n,k}$ being output from the integrating circuit $21_{n,k}$ at this time where the switch$_{221}$ is turned from a closed state to an opened state is held by the capacitor $C_{22}$.

Thereafter, as a result of control by the column selecting section 70, the switch $SW_{222}$ of each holding circuit $22_{n,k}$ is sequentially closed for only a fixed period. Thereby, the voltages $V_{1,1}, V_{1,2}, V_{2,1}, V_{2,2}, V_{3,1}, V_{3,2}, \ldots, V_{n,1}, V_{n,2}, \ldots, V_{N,1}$, and $V_{N,2}$ are output in order from the signal readout section 20 to the buffer circuit 30.

Then, in the A/D converting section 40, the voltage $V_{n,k}$ output from the signal readout section 20 and passed through the buffer circuit 30 is A/D-converted, and the digital value $D_{n,k}$ according to the input voltage $V_{n,k}$ is output to the adding section 50. At this time, the digital values $D_{1,1}, D_{1,2}, D_{2,1}, D_{2,2}, D_{3,1}, D_{3,2}, \ldots, D_{n,1}, D_{n,2}, \ldots, D_{N,1}$, and $D_{N,2}$ are output in order from the A/D converting section 40 to the adding section 50.

Further, in the adding section 50, a sum of digital values $D_{n,1}$ and $D_{n,2}$ to be output from the A/D converting section 40 is operated, and a digital value $D_n$ ($=D_{n,1}+D_{n,2}$) being a sum value thereof is output. At this time, the digital values $D_1, D_2, D_3, \ldots, D_n, \ldots, D_N$ are output in order from the adding section 50.

Here, the digital value $D_{n,k}$ is a value according to the amount of an electric charge generated in a photodiode $PD_k$ of the pixel $P_{m,n}$ located on the m-th row and the n-th column, that is, a value according to the amount of incident light into the photodiode $PD_k$ of the pixel $P_{m,n}$. Moreover, the digital value $D_n$ is a value according to the total amount of electric charges generated in the two respective photodiodes $PD_1$ and $PD_2$ included in the pixel $P_{m,n}$, that is, a value according to the amount of incident light into the pixel $P_{m,n}$.

When the digital values $D_1$ to $D_N$ according to the amount of incident light into the N respective pixels $P_{m,1}$ to $P_{m,N}$ existing on the m-th row are thus obtained, subsequently, the digital values $D_1$ to $D_N$ according to the amount of incident light into the N respective pixels $P_{m+1,1}$ to $P_{m+1,N}$ existing on the next (m+1)-th row are obtained in the same manner. As a result of such an operation being performed for all rows, the digital values according to the amount of incident light into the M×N respective pixels $P_{1,1}$ to $P_{M,N}$ of the imaging region 10 are obtained, so that image pickup data is obtained.

As above, in the solid-state image pickup device 1 according to the present embodiment, two photodiodes $PD_1$ and $PD_2$ are included in each pixel $P_{m,n}$ of the imaging region 10, voltages $V_{n,1}$ and $V_{n,2}$ and digital values $D_{n,1}$ and $D_{n,2}$ according the amount of electric charge generated in the photodiodes $PD_1$ and $PD_2$ are obtained, and then a digital value $D_n$ $(=D_{n,1}+D_{n,2})$ according to the amount of incident light into the pixel $P_{m,n}$ is obtained. This allows performing imaging with an excellent S/N ratio even when, for example, it is necessary that the photosensitive region of each pixel $P_{m,n}$ has a large area when the solid-state image pickup device 1 is used for a dental application.

That is, it is supposed, as a comparative example, that each pixel includes one photodiode, and the photodiode has a junction capacitance value of C. In this case, the size of a noise component included in the digital value to be output from the A/D converting section is expressed as "A×C." Here, A is a constant determined by the amplifier included in the integrating circuit.

On the other hand, in the present embodiment, if each pixel includes two photodiodes, and the area of the entire photosensitive region of each pixel is the same as that of the above-mentioned comparative example, the junction capacitance value of the individual photodiodes becomes C/2. Therefore, the size of a noise component included in the digital value $D_{n,k}$ to be output from the A/D converting section 40 is expressed as "A×C/2," and the size of a noise component included in the digital value $D_n$ to be output from the adding section 50 is expressed as "A×C/$2^{0.5}$." As above, in the present embodiment, the size of a noise component included in the digital value $D_n$ according to the amount of incident light into each pixel $P_{m,n}$ becomes $\frac{1}{2}^{0.5}$ times as compared with that of the above-mentioned comparative example.

Moreover, the upper limit of a dynamic range of light detection is determined by the upper limit of the amount of an electric charge that can be accumulated in the junction capacitance section of a photodiode or the saturation level of output voltage of the integrating circuit to read out the electric charge, whichever is lower. As in the case of a dental application, when the area of the photosensitive region of the photodiode is large, the amount of an electric charge that can be accumulated in the junction capacitance section of the photodiode is also large, so that the dynamic range is limited by saturation of output voltage of the integrating circuit. Moreover, with a reduction in supply voltage for lowering power consumption in recent years, drive voltage of the amplifier also tends to be lowered, and thus the saturation voltage level of the amplifier tends to further drop. Under such circumstances, an electric charge in excess of saturation of the amplifier included in the integrating circuit is wasted even if a large amount of electric charge can be accumulated in the junction capacitance section of the photodiode.

On the other hand, in the present embodiment, the amount of an electric charge to be accumulated in the individual integrating circuits is halved as compared with that in the above-mentioned comparative example, so that the individual pixels can handle electric charge up to double the amount as signals. Based thereon, when, for example, an output digital value from the A/D converting section 40 is 12 bits, an output digital value from the adding section 50 is extended to 13 bits. Moreover, as described above, the size of a noise component has become $\frac{1}{2}^{0.5}$ times, so that the S/N ratio at the upper limit of the dynamic range becomes $2\sqrt{2}$ times.

The present invention is by no means limited to the above-mentioned embodiment and various modifications can be made. For example, the number of photodiodes included in each pixel may be 3 or more although this has been provided as 2 in the above-mentioned embodiment. Moreover, the present invention, in respect to irradiating X-rays onto a human body, relates to X-ray solid-state image pickup devices for medical use in general, without limitation to dental treatment applications.

The invention claimed is:

1. A solid-state image pickup device comprising:
   an imaging region in which a plurality of pixels are arranged two dimensionally,
   each of the pixels including a plurality of photodiodes, the photodiodes of each of the pixels including
   a first photodiode, and
   a second photodiode;
   a signal readout section for outputting a voltage according to an amount of electric charge generated in the plurality of respective photodiodes included in each pixel of the imaging region,
   the signal readout section including a plurality of integrating circuits,
   the first photodiode being connected to a first integrating circuit of the integrating circuits via a first switch,
   the second photodiode being connected to a second integrating circuit of the integrating circuits via a second switch,
   each of the first and second integrating circuits comprising:
      an amplifier having input and output terminals;
      a capacitor provided between the input and output terminals of the first amplifier,
      a switch provided between the input and output terminals of the first amplifier;
   an A/D converting section for being input with and A/D-converting a voltage output from the signal readout section, and outputting a digital value according to the input voltage; and
   an adding section for operating, for each pixel of the imaging region, a sum of digital values to be output from the A/D converting section according to an amount of electric charge generated in the plurality of respective photodiodes included in the pixel, and outputting a digital value being a sum value thereof, wherein
   photosensitive regions of the plurality of respective photodiodes included in each pixel of the imaging region have a square shape as a whole,
   the pixels are arranged two dimensionally in M rows and N columns, where each of M and N is an integer no less than 2, and
   a total number of the first and second integrating circuits is equal to 2N.

2. The solid-state image pickup device according to claim 1, wherein photosensitive regions of the plurality of respective photodiodes included in each pixel of the imaging region have mutually equal areas.

3. The solid-state image pickup device according to claim 1, wherein a length of one side of said square shape is not less than 150 μm.

4. The solid-state image pickup device according to claim 3, wherein said length is not more than 200 μm.

5. The solid-state image pickup device according to claim 3, wherein the first integrating circuit and the second integrating circuit have common configuration.

* * * * *

UNITED STATES PATENT AND TRADEMARK OFFICE
CERTIFICATE OF CORRECTION

PATENT NO. : 8,482,644 B2  Page 1 of 1
APPLICATION NO. : 12/307173
DATED : July 9, 2013
INVENTOR(S) : Mori et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 703 days.

Signed and Sealed this
Eighth Day of September, 2015

Michelle K. Lee
*Director of the United States Patent and Trademark Office*